United States Patent
Sonehara

(10) Patent No.: US 8,723,150 B2
(45) Date of Patent: May 13, 2014

(54) SEMICONDUCTOR MEMORY DEVICE HAVING A REVERSIBLY VARIABLE RESISTANCE LAYER

(75) Inventor: Takeshi Sonehara, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/601,340

(22) Filed: Aug. 31, 2012

(65) Prior Publication Data

US 2013/0234086 A1    Sep. 12, 2013

(30) Foreign Application Priority Data

Mar. 12, 2012  (JP) .................................. 2012-54194

(51) Int. Cl.
*H01L 29/00* (2006.01)

(52) U.S. Cl.
USPC .................................................. 257/1; 257/2

(58) Field of Classification Search
USPC ................................................. 257/1, 2, 659
See application file for complete search history.

(56) References Cited

U.S. PATENT DOCUMENTS

| | | | |
|---|---|---|---|
| 6,753,561 B1 * | 6/2004 | Chevallier et al. | 257/295 |
| 2007/0210368 A1 * | 9/2007 | Cho et al. | 257/314 |
| 2008/0258129 A1 | 10/2008 | Toda | |
| 2010/0315857 A1 | 12/2010 | Sonehara | |
| 2011/0210303 A1 * | 9/2011 | Muraoka et al. | 257/2 |
| 2012/0069625 A1 * | 3/2012 | Wada | 365/148 |

FOREIGN PATENT DOCUMENTS

| | | |
|---|---|---|
| JP | 03-104285 | 5/1991 |
| JP | 2005-522045 | 7/2005 |
| JP | 2010-80490 | 4/2010 |
| JP | 2010-287789 | 12/2010 |

* cited by examiner

*Primary Examiner* — Thao Le
*Assistant Examiner* — Laura Dykes
(74) *Attorney, Agent, or Firm* — Oblon, Spivak, McClelland, Maier & Neustadt, L.L.P.

(57) ABSTRACT

A semiconductor memory device according to an embodiment comprises a semiconductor layer, a variable resistance layer, a sidewall layer, and a buried layer. The semiconductor layer functions as a rectifying device. The variable resistance layer is provided above or below the semiconductor layer and reversibly changes its resistance. The sidewall layer is in contact with a sidewall of the semiconductor layer. The buried layer is embedded in the sidewall layer and is made of material different from that of the sidewall layer. These configurations may adjust the electrical characteristics of the rectifying device to any value.

15 Claims, 7 Drawing Sheets

SEMICONDUCTOR MEMORY DEVICE HAVING A REVERSIBLY VARIABLE RESISTANCE LAYER

CROSS-REFERENCE TO RELATED APPLICATIONS

This application is based upon and claims the benefit of priority from the prior Japanese Patent Application No. 2012-54194, filed on Mar. 12, 2012, the entire contents of which are incorporated herein by reference.

FIELD

The embodiments described in the present specification relate to a semiconductor memory device.

BACKGROUND

An electrically-rewritable variable-resistive element such as ReRAM or PRAM recently draws attention. The variable resistive element is provided in a memory cell. The variable resistive element is configured to be able to reversibly change its resistance according to the supplied current. The memory cell stores data according to the change of the resistance of the variable resistive element. Therefore, it is necessary to flow a current only through the variable resistive element in the selected memory cell and not to flow a current through the variable resistive element in the non-selected memory cell. Thus, the variable resistive element is connected in series with a rectifying device such as diode.

Here, because of the request for high densification of the memory cells, the rectifying device size needs to be limited. Additionally, the electrical characteristics of the rectifying device need to be adjusted to allow repeated set operations and reset operations on a memory cell. Unfortunately, it is difficult to provide a smaller rectifying device as well as to adjust its electrical characteristics to any value.

DETAILED DESCRIPTION

Figure 1:
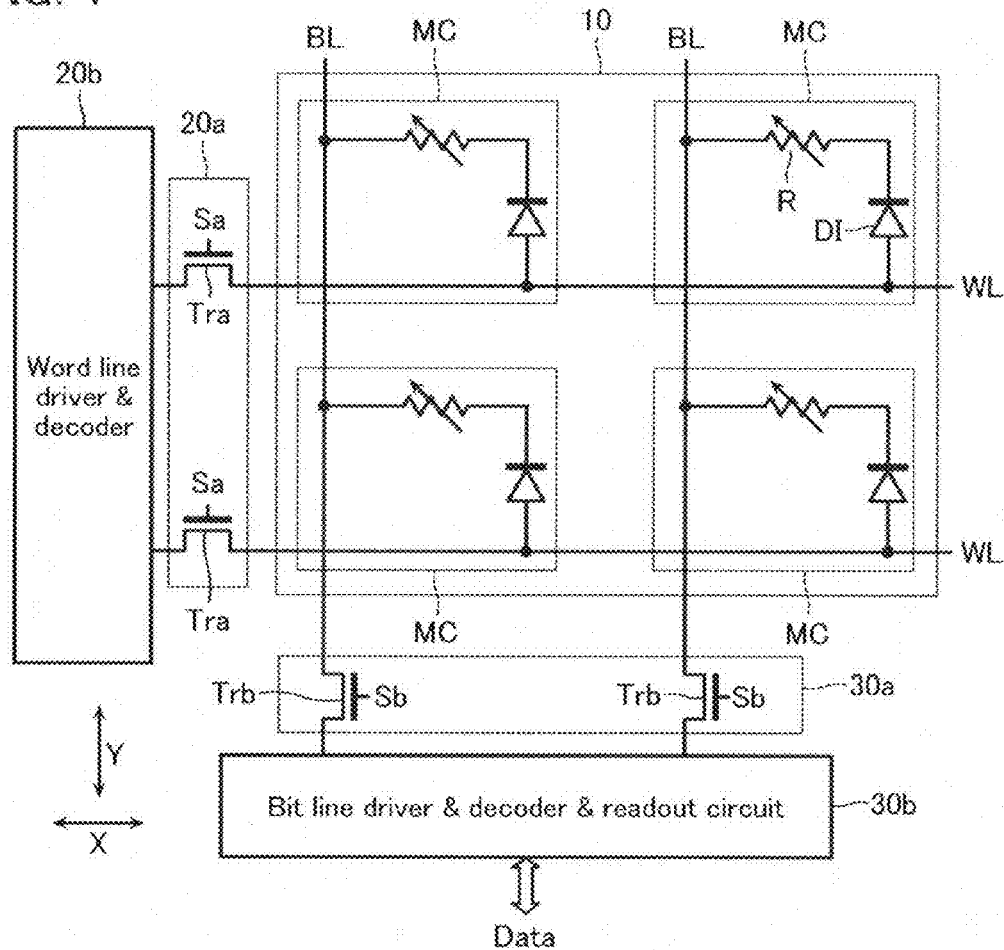
FIG. 1 is a circuit diagram of a semiconductor memory device according to a first embodiment

A semiconductor memory device according to the embodiments described below includes a semiconductor layer, a variable resistance layer, a sidewall layer, and a buried layer. The semiconductor layer functions as a rectifying device. The variable resistance layer is provided above or below the semiconductor layer and reversibly changes its resistance. The sidewall layer is in contact with a sidewall of the semiconductor layer. The buried layer is embedded in the sidewall layer and is made of material different from that of the sidewall layer.

Referring now to the drawings, the embodiments of the semiconductor memory device will be described.

First Embodiment

[Configuration]

Referring first to FIG. 1, the circuitry of a semiconductor memory device according to a first embodiment will be described. With reference to FIG. 1, the semiconductor memory device according to the first embodiment includes a memory cell array 10, a word line selection circuit 20a, a word line driver circuit 20b, a bit line selection circuit 30a, and a bit line driver circuit 30b.

With reference to FIG. 1, the memory cell array 10 includes word lines WL and bit lines BL that are crossing each other and memory cells MC disposed in crossing portions of the word lines WL and the bit lines BL. The word lines WL are arranged in a y-direction at a predetermined pitch and extend in a x-direction. The bit lines BL are arranged in the x-direction at a predetermined pitch and extend in the y-direction. The memory cells MC are disposed in a matrix in a plane extending in the x- and y-directions.

With reference to FIG. 1, each memory cell MC includes a diode DI and a variable resistive element R. The anode of the diode DI is connected to one of the word lines WL. The cathode of the diode DI is connected to a first end of a variable resistive element R. The variable resistive element R is electrically rewritable. Each memory cell MC thus stores data in a non-volatile manner according to the resistance. The variable resistive element R reversibly changes its resistance. A second end of the variable resistive element R is connected to one of the bit lines BL. Note that the forward direction of the diode DI may be the direction from the word line WL side to the bit line BL side or the direction from the bit line BL side to the word line WL side.

With reference to FIG. 1, the word line selection circuit 20a includes a plurality of select transistors Tra. Each select transistor Tra has a first end connected to a first end of one of the word lines WL. Each select transistor Tra has a second end connected to the word line driver circuit 20b. The gate of each select transistor Tra is supplied with a signal Sa. The word line selection circuit 20a controls the signals Sa, thereby selectively connecting the word lines WL to the word line driver circuit 20b.

With reference to FIG. 1, the word line driver circuit 20b applies voltages to the word lines WL, the voltages being necessary for the data erase of the memory cells MC, the data write to the memory cells MC, and the data read from the memory cells MC.

With reference to FIG. 1, the bit line selection circuit 30a includes a plurality of select transistors Trb. Each select transistor Trb has a first end connected to a first end of one of the bit lines BL. Each select transistor Trb has a second end connected to the bit line driver circuit 30b. The gate of each select transistor Trb is supplied with a signal Sb. Specifically, the bit line selection circuit 30a controls the signals Sb, thereby selectively connecting the bit lines BL to the bit line driver circuit 30b.

With reference to FIG. 1, the bit line driver circuit 30b applies voltages to the bit lines BL, the voltages being necessary for the data erase of the memory cells MC, the data write to the memory cells MC, and the data read from the memory cells MC. Further, the bit line driver circuit 30b externally outputs data read from the bit lines BL.

Figure 2:
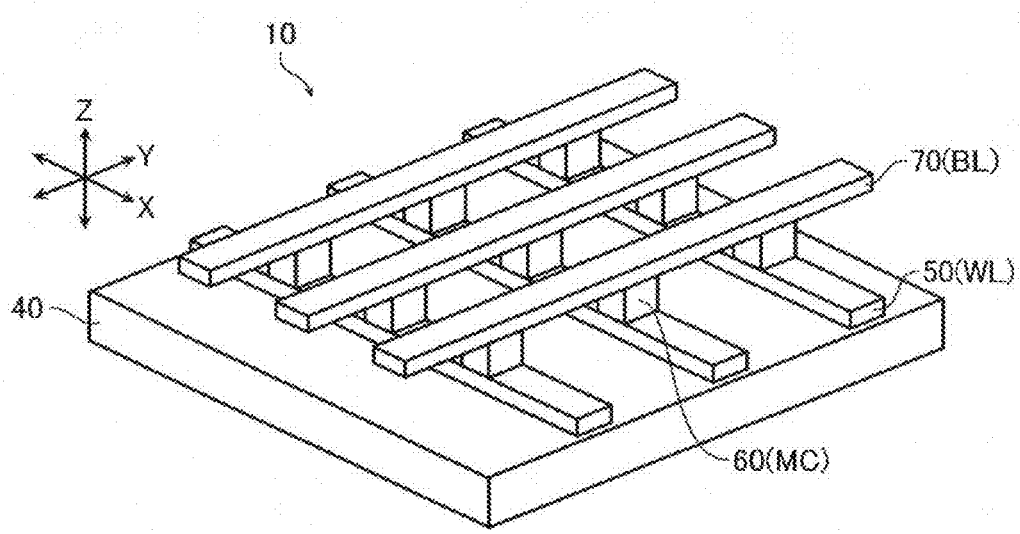
FIG. 2 is a perspective view of a memory cell array 10 according to the first embodiment

FIG. 2 is a perspective view showing the stacked structure of the memory cell array 10 according to the first embodiment. With reference to FIG. 2, the memory cell array 10 is formed on the upper layer of a substrate 40. The memory cell array 10 includes first conductive layers 50, memory layers 60, and second conductive layers 70, from the lower layer to the upper layer. The first conductive layers 50 function as the word lines WL. The memory layers 60 function as the memory cells MC. The second conductive layers 70 function as the bit lines BL.

With reference to FIG. 2, the first conductive layers 50 are formed in a stripe pattern that extends in the x-direction and are arrayed in the y-direction at a predetermined pitch. Preferably, each first conductive layer 50 is made of a material that is thermally resistant and has low resistance. Each first conductive layer 50 is made of, for example, W, WN, Al, Ti, V, Cr, Mn, Fe, Co, Ni, Cu, TiN, WSix, TaSix, PdSix, ErSix, YSix, PtSix, HfSix, NiSix, CoSix, TiSix, VSix, CrSix, MnSix, FeSix, or a combination thereof comprising a stack.

With reference to FIG. 2, the memory layers 60 are arranged in a matrix in the x- and y-directions. The memory layers 60 are provided between the first conductive layers 50 and the second conductive layers 70.

With reference to FIG. 2, the second conductive layers are formed in a stripe pattern that extends in the y-direction and are arrayed in the x-direction at a predetermined pitch. The second conductive layers 70 are made of a material similar to that of the first conductive layer 50.

Figure 3:
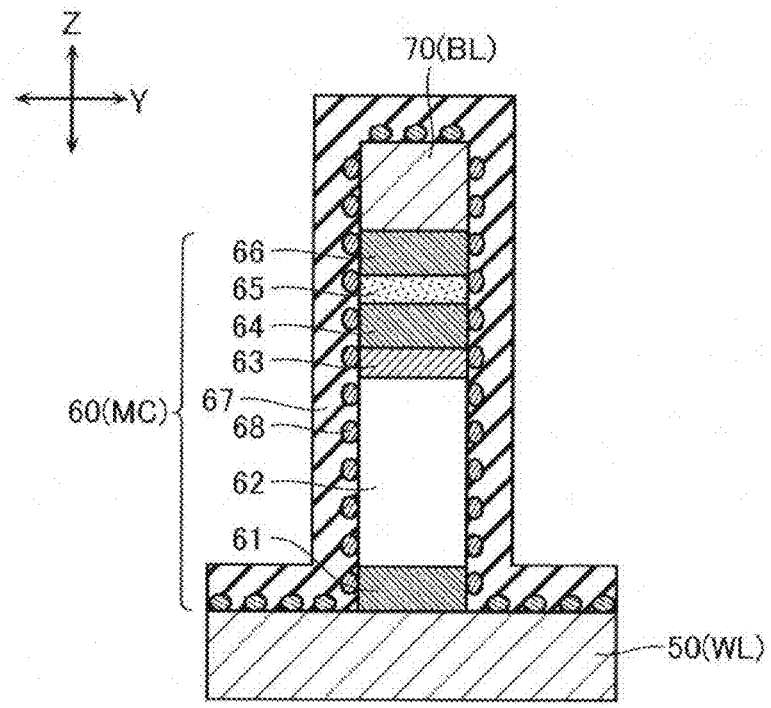
FIG. 3 is a cross-sectional view of a memory layer 60 according to the first embodiment

Referring now to FIG. 3, the detailed stacked structure of each memory layer 60 will be described. FIG. 3 is a cross-sectional view showing one of the memory layers 60. With reference to FIG. 3, each memory layer 60 includes an electrode layer 61, a diode layer 62, a silicide layer 63, an electrode layer 64, a variable resistance layer 65, an electrode layer 66, a sidewall insulating layer 67, and a buried layer 68.

The electrode layer 61 is formed on one of the first conductive layers 50. The electrode layer 61 has a thickness of, for example, 10 nm, and is made of monometal, a plurality of mixtures, silicide, oxide, nitride or the like. Specifically, the electrode layer 61 is made of, Pt, Au, Ag, TiAlN, SrRuO, Ru, RuN, Ir, Ti, V, Cr, Mn, Fe, Co, Ni, Cu, TiN, TaN, LaNiO, Al, PtIrO$_x$, PtRhO$_x$, Rh, TaAlN, SiTiO$_x$, WSi$_x$, TaSi$_x$, PdSi$_x$, PtSi$_x$, IrSi$_x$, ErSi$_x$, YSi$_x$, HfSi$_x$, NiSi$_x$, CoSi$_x$, TiSi$_x$, VSi$_x$, CrSi$_x$, MnSi$_x$, FeSi$_x$, or the like. The electrode layer 61 may function as a barrier metal or a bonding layer.

The diode layer 62 is in contact with an upper surface of the electrode layer 61. The diode layer 62 functions as the diode DI. Specifically, the diode layer 62 functions as any of a PIM diode, a PIN diode, and an NIM diode. Note that the PIM diode may be formed having a smaller film thickness than the PIN diode.

A p-type semiconductor layer and an n-type semiconductor layer included in the diode are selected from the group consisting of III-V semiconductors such as Si, SiGe, SiC, Ge, C, and GaAs, II-VI semiconductors such as ZnSe, oxide semiconductor, nitride semiconductor, carbide semiconductor, and sulfide semiconductor. Preferably, the p-type semiconductor layer (anode layer) includes p-type Si, TiO$_2$, ZrO$_2$, InZnOx, ITO, SnO$_2$ containing Sb, ZnO containing Al, AgSbO$_3$, InGaZnO$_4$, ZnOSnO$_2$, and a combination thereof. Preferably, the n-type semiconductor layer (cathode layer) includes n-type Si, NiOx, ZnO, Rh$_2$O$_3$, NZnO, La$_2$CuO$_4$, and a combination thereof.

The silicide layer 63 is in contact with an upper surface of the diode layer 62 and is made of, for example, titanium silicide (TiSi$_2$). The electrode layer 64 is in contact with an upper surface of the silicide layer 63 and is made of a material similar to that of the electrode layer 61.

The variable resistance layer 65 is contact with an upper surface of the electrode layer 64. The variable resistance layer 65 functions as the variable resistive element R, and reversibly changes its resistance depending on the polarity of the applied voltage. The variable resistance layer 64 is made of, for example, metal oxide.

The variable resistance layer 65 is made of, for example, binary or ternary metal oxide or organic matter such as carbon. Here, carbon includes nanotube and a two-dimensional structure such as graphene and fullerene. The variable resistance layer 65 may include an impurity atom, the impurity atom forming a defect level, or a semiconductor/metal dot (quantum dot).

The electrode layer 66 is in contact with an upper surface of the variable resistance layer 65. The electrode layer 66 is made of a material similar to those of the electrode layers 61 and 63. Note that the second conductive layer 70 is in contact with an upper surface of the electrode layer 66.

The sidewall insulating layer 67 is in contact with side surfaces (sidewalls) of the electrode layer 61, the diode layer 62, the silicide layer 63, the electrode layer 64, the variable resistance layer 65, and the electrode layer 66. The sidewall insulating layer 67 is made of, for example, silicon nitride (SiN).

The buried layer 68 is embedded in the sidewall insulating layer 67. The buried layer 68 is in contact with side surfaces of the electrode layer 61, the diode layer 62, the silicide layer 63, the electrode layer 64, the variable resistance layer 65, and the electrode layer 66. The buried layer 68 is formed in a dot pattern. Here, the dot pattern includes a granular shape, an elliptical granular shape, and a fragment of a liner shape, each having a size of about from 0.5 nm to 5 nm. The buried layer 68 forms an interface state and a defect level between the buried layer 68 and the sidewall insulating layer 67. The buried layer 68 is made of a material that may adjust the electrical characteristics of the diode layer 62 (diode DI). The buried layer 68 is made of a material that has a charge generation property, the material being different from the material of the sidewall insulating layer 67. For example, the buried layer 68 is made of metal, metal oxide, insulator, semiconductor comprising p-type and n-type (including Si, SiC, SiGe, Ge, C, GeAs, and their oxides, nitrides, carbides), boride, SiN$_x$ (X=0 to 2), SiO$_x$, or a combination thereof.

[Operation]

Figure 4:
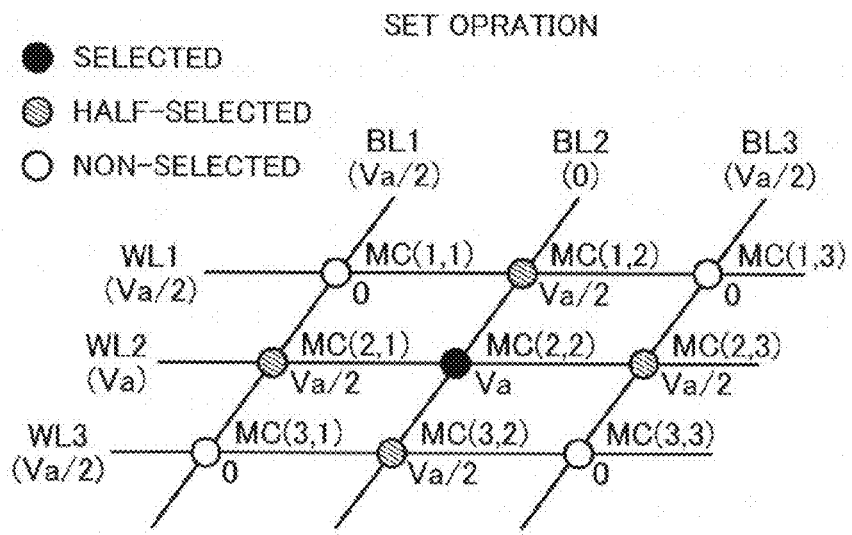
FIG. 4 illustrates a set operation according to the first embodiment

Referring now to FIG. 4, the operation of the semiconductor memory device according to this embodiment will be described. FIG. 4 shows an example of the voltage relationship in the set operation for a selected memory cell MC (2, 2). Here, the set operation is an operation that changes the memory cell MC from the high resistance state to the low resistance state.

With reference to FIG. 4, in the set operation, the selected word line WL2 is applied with a voltage Va, and the non-selected word lines WL1 and WL3 are applied with a voltage Va/2. Further, the selected bit line BL2 is applied with 0V, and the non-selected bit lines BL1 and BL3 are applied with a voltage Va/2. Thus, the non-selected memory cells MC (1, 1), MC (1, 3), MC (3, 1), and MC (3, 3) are applied with a voltage of 0V. The half-selected memory cells MC (1, 2), MC (2, 1), MC (2, 2), and MC (3, 2) are applied with a voltage of Va/2. Further, the selected memory cell MC (2, 2) is applied with a voltage of Va.

In such a set operation, the diode DI allows current through the variable resistive element VR in the selected memory cell MC (2, 2). Meanwhile, as the diode DI is configured not to draw current at a voltage below Va/2, the variable resistive elements VR in the half-selected memory cells MC (1, 2) to MC (3, 2) and the non-selected memory cells MC (1, 1) to MC (3, 3) do not draw current. Further, in the reset operation that changes the memory cell MC from the low resistance state to the high resistance state, only the variable resistive element VR in the selected memory cell MC (2, 2) draws current, as in the set operation. In this embodiment, the above buried layer 68 adjusts the electrical characteristics of the diode DI to allow for the above operations.

[Advantages]

Figure 5:
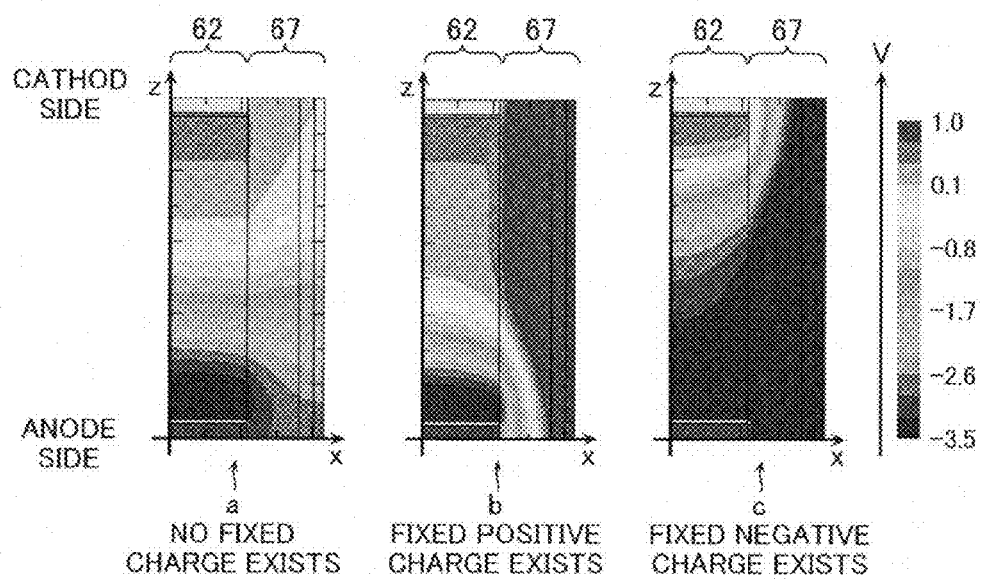
FIG. 5 illustrates a change of a potential distribution caused by charge held in a sidewall insulating layer 67.
Figure 6:
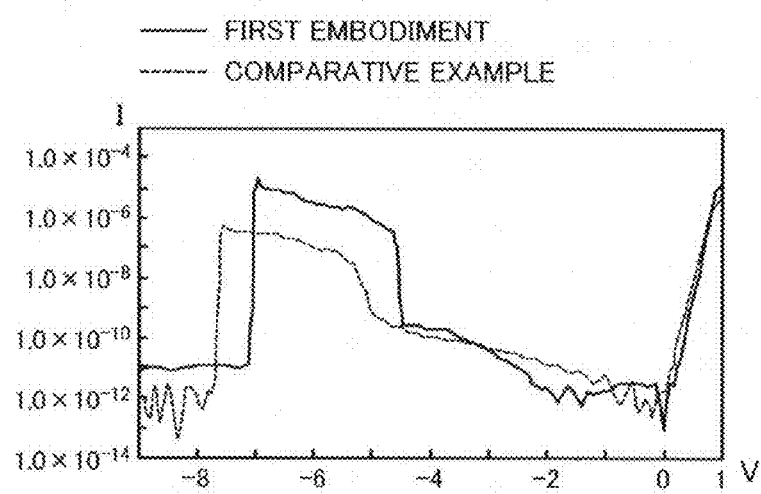
FIG. 6 illustrates I-V characteristics of a diode DI according to the comparative example and the first embodiment.

Referring now to FIG. 5 and FIG. 6, the advantages according to the first embodiment will be described. FIG. 5 shows a change of the potential distribution due to charge held in the sidewall insulating layer 67. Here, if fixed charge does not exist in the sidewall insulating layer 67, an electric field concentration does not occur in the diode layer 62, as shown in reference "a" of FIG. 5. In contrast, if fixed positive charge exists in the sidewall insulating layer 67, an electric field concentration occurs on the anode side of the diode layer 62, as shown in reference "b" of FIG. 5. In this case, more reverse current flows than in reference "a" of FIG. 5. Further, if fixed negative charge exists in the sidewall insulating layer 67, an electric field concentration occurs on the cathode side of the diode layer 62, as shown in reference "c" of FIG. 5. In this case, less reverse current flows than in reference "a" of FIG. 5. Thus, as shown in reference "a" to "c" of FIG. 5, as the electric field concentration and the reverse current value change depending on the fixed charge in the sidewall insulating layer 67, the memory cell MC is likely to malfunction.

Therefore, in this embodiment, the buried layer 68 embedded in the sidewall insulating layer 67 adjusts the band width, the energy level value, and the number of energy levels of the diode layer 62. Thus, in this embodiment, the fixed charge in the sidewall insulating layer 67 may be adjusted to set the electric field concentration and the reverse current value to any value to limit the malfunction of the memory cell MC. Note that even for more compact diode layer 62 (diode DI), the advantage by the above buried layer 68 occurs.

For example, in this embodiment, if it is required to relax the electric field concentration in the diode layer 62, the buried layer 68 may cause fixed negative or positive charge to cancel the fixed positive or negative charge in the sidewall insulating layer 67. Further, if it is required to increase the reverse current of the diode DI, the buried layer 68 may cause fixed positive potential, as shown in FIG. 5. Further, if it is required to limit the reverse current of the diode DI, the buried layer 68 may cause fixed negative potential, as shown in FIG. 5.

Here, it is assumed that if a band modulation is performed to allow the buried layer 68 to provide fixed positive potential, the sidewall insulating layer 67 is made of a silicon oxide film, and the buried layer 68 is made of a material having a small work function for the center of the band gap of silicon (or larger Fermi level than center of the band gap). In this case, for example, the sidewall insulating layer 67 is made of a silicon oxide film and the buried layer 68 is made of n-type silicon or metal. Meanwhile, it is also assumed that if a band modulation is performed to allow the buried layer 68 to provide fixed negative potential, the sidewall insulating layer 67 is made of a silicon oxide film, and the buried layer 68 is made of a material having a large work function for the center of the band gap of silicon (or smaller Fermi level than center of the band gap). In this case, for example, the sidewall insulating layer 67 is made of a silicon oxide film and the buried layer 68 is made of p-type silicon or metal.

As another example, if the buried layer 68 causes negative charge, the buried layer 68 is made of silicon and the sidewall insulating layer 67 is made of silicon nitride (SiN). In this case, negative charge between silicon nitride and silicon is used.

As another example, if the buried layer 68 causes negative charge, the sidewall insulating layer 67 is made of silicon dioxide ($SiO_2$) and the buried layer 68 is made of silicon nitride (SiN).

As another example, if the buried layer 68 causes negative charge, the sidewall insulating layer 67 is made of silicon (Si) and the buried layer 68 is made of silicon nitride (SiN).

As another example, if the buried layer 68 causes positive charge, the sidewall insulating layer 67 is made of silicon nitride (SiN). Then, a defect in the sidewall insulating layer 67 or a contaminated site due to metal in the sidewall insulating layer 67 functions as the buried layer 68. To enhance the advantage of causing fixed positive potential, it is desired to form the buried layer 68 in the vicinity of the interface between the sidewall insulating layer 67 and the diode layer 62.

As another example, if the buried layer 68 causes positive charge, the sidewall insulating layer 67 is made of silicon nitride (SiN) and the buried layer 68 is made of a silicon oxynitride film (SiON).

As another example, if the buried layer 68 causes negative charge, the sidewall insulating layer 67 is made of silicon nitride (SiN) and the buried layer 68 is made of silicon dioxide ($SiO_2$).

For example, this embodiment may provide a larger reverse current than the comparative example having no buried layer 68, as shown in FIG. 6. This embodiment may also adjust the threshold voltages of the forward direction bias and reverse direction bias of the diode DI to any value different from that in the comparative example.

The rectifying property of the diode DI changes according to charges accumulated in the sidewall insulating layer 67. And, the change of characteristic may cause the diode DI to switch easily. Also, with changing current according to the characteristic of switching, the diode DI may function as a memory. For example, by selecting the word line WL and bit line BL and applying a pulse voltage to the diode DI before (or after) an operation for the memory cell MC, charges may be stored in the sidewall insulating layer 67.

[Manufacturing Method]

Figure 7:
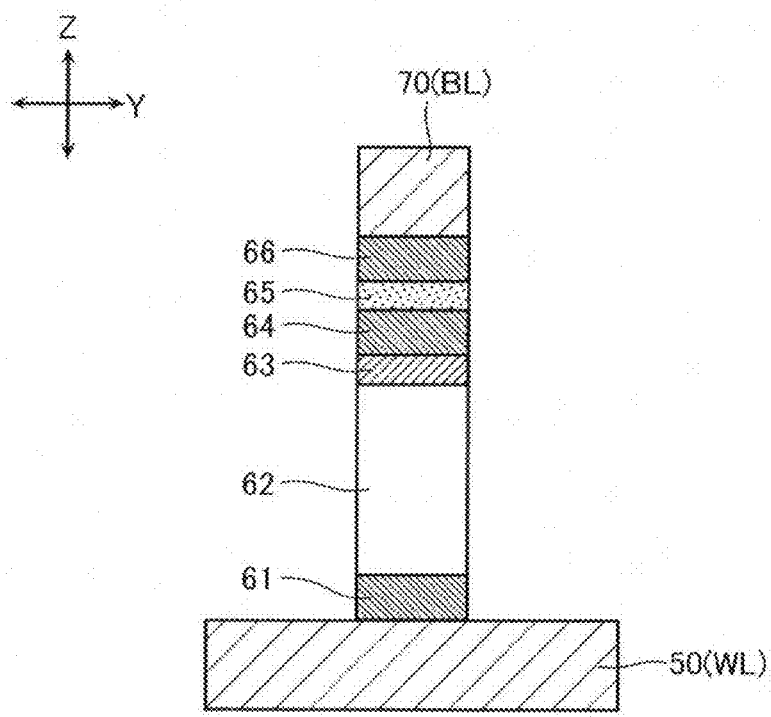
FIG. 7 is a cross-sectional view showing a manufacturing process of a semiconductor memory device according to the first embodiment.
Figure 8:
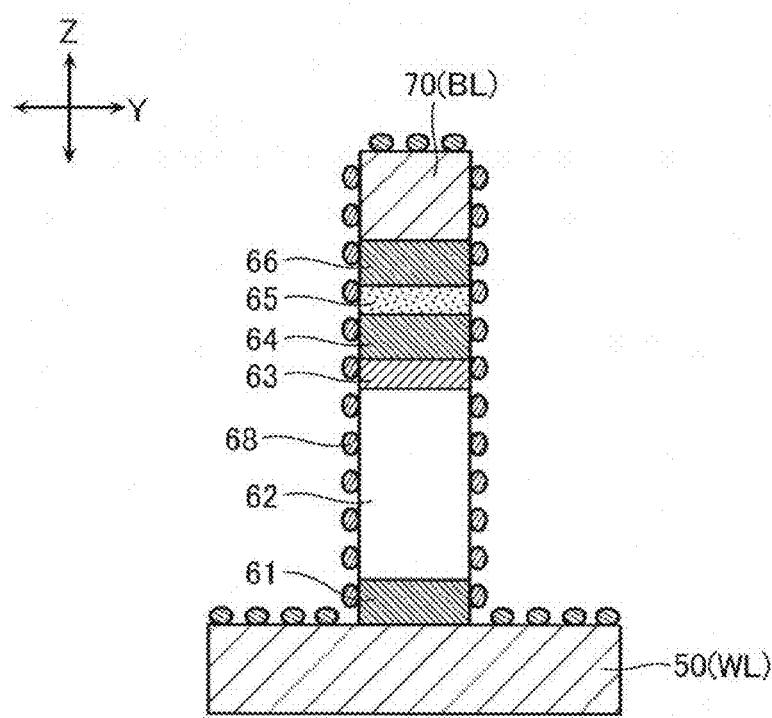
FIG. 8 is a cross-sectional view showing a manufacturing process of a semiconductor memory device according to the first embodiment.

Referring now to FIG. 7 and FIG. 8, a method of manufacturing the semiconductor memory device according to the first embodiment will be described. First, with reference to FIG. 7, on the first conductive layer 50, the electrode layer 61, the diode layer 62, the silicide layer 63, the electrode layer 64, the variable resistance layer 65, the electrode layer 66, and the second conductive layer 70 are deposited, and they are machined into a predetermined shape by RIE.

Then, with reference to FIG. 8, the dot pattern buried layer 68 is formed on side surfaces of the electrode layer 61, the diode layer 62, the silicide layer 63, the electrode layer 64, variable resistance layer 65, the electrode layer 66, and the second conductive layer 70. Here, if the buried layer 68 is made of metal or metal oxide, the buried layer 68 is formed by CVD or sputtering. Note that after the buried layer 68 is formed, annealing or plasma oxidation may be performed. Further, side surfaces of the electrode layer 61 to the second conductive layer 70 may be contaminated by desired metal and the buried layer 68 may be transferred to those side surfaces. In this case, a process such as RIE may be used to selectively transfer the buried layer 68 to those side surfaces of the electrode layer 61 to the second conductive layer 70. In WET of machining or post process such as ashing, contamination or residual may be left or removed.

After the processes shown in FIG. 8, silicon nitride (SiN) is deposited to embed the buried layer 68, thus forming the sidewall insulating layer 67. The memory layer 60 shown in FIG. 3 is thus formed.

Second Embodiment

Figure 9:
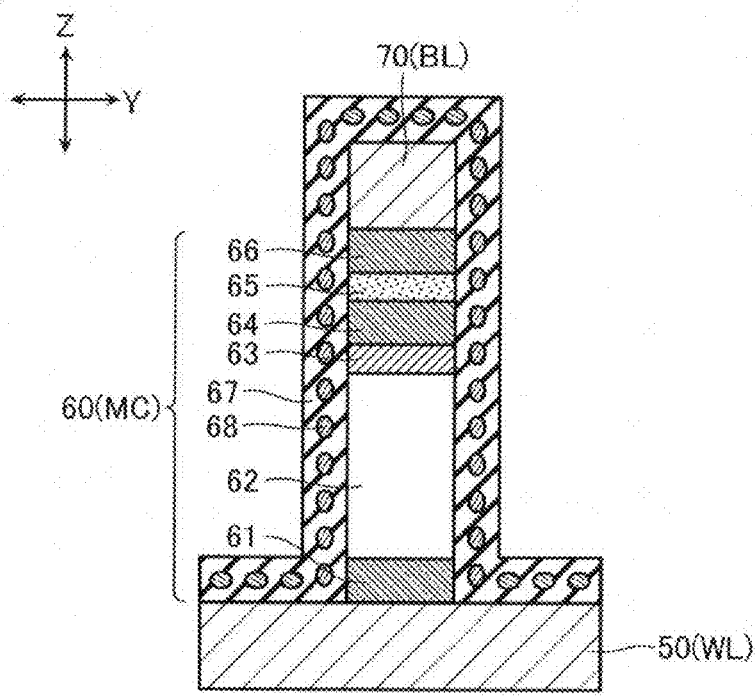
FIG. 9 is a cross-sectional view of a memory layer 60 according to a second embodiment.

Referring now to FIG. 9, a semiconductor memory device according to a second embodiment will be described. With reference to FIG. 9, the second embodiment is different from the first embodiment only in terms of the buried layer 68. Note that other configurations in the second embodiment are similar to those in the first embodiment and thus their description is omitted here.

With reference to FIG. 9, in the second embodiment, the buried layer 68 is formed near the center in the thickness direction of the sidewall insulating layer 67, and thus is not in contact with the electrode layer 61, the diode layer 62, the silicide layer 63, the electrode layer 64, the variable resistance layer 65, or the electrode layer 66. Even in such a configuration, the second embodiment may exert an advantage similar to that in the first embodiment.

Figure 10:
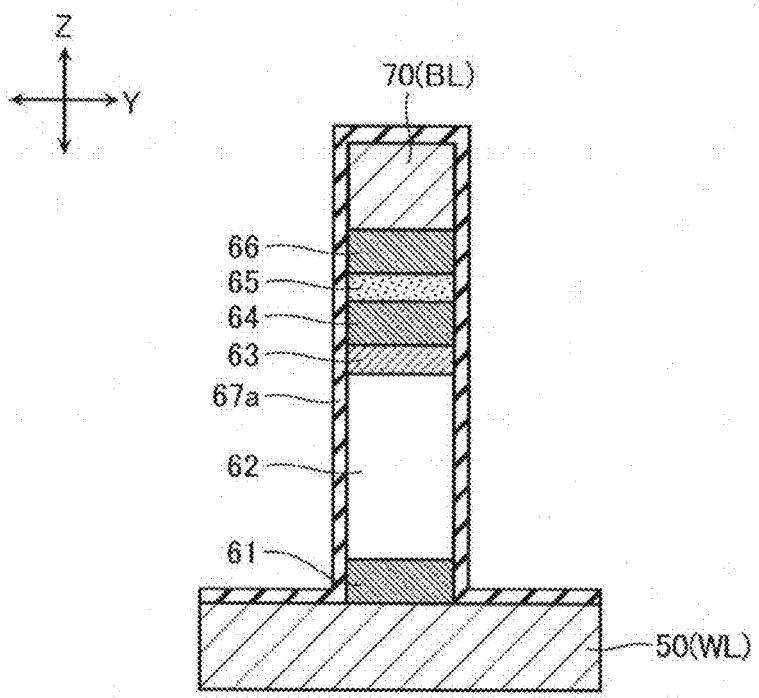
FIG. 10 is a cross-sectional view showing a manufacturing process of a semiconductor memory device according to the second embodiment.
Figure 11:
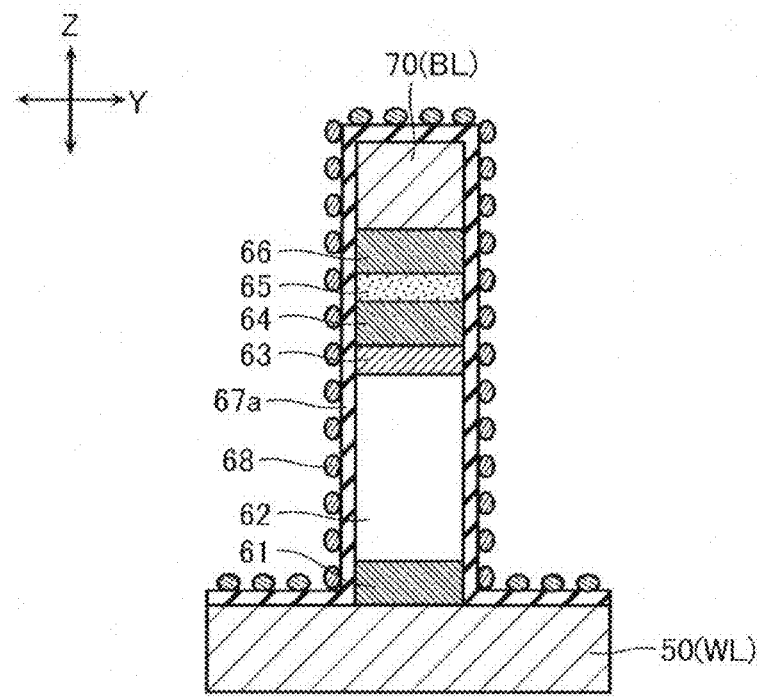
FIG. 11 is a cross-sectional view showing a manufacturing process of a semiconductor memory device according to the second embodiment.

Referring now to FIG. 10 and FIG. 11, a method of manufacturing the semiconductor memory device according to the second embodiment will be described. First, a process similar to that in FIG. 7 according to the first embodiment is performed. Then, with reference to FIG. 10, silicon nitride (SiN) is deposited to form a sidewall insulating layer 67a in contact with side surfaces of the electrode layer 61, the diode layer 62, silicide layer 63, the electrode layer 64, the variable resistance layer 65, and the electrode layer 66.

Then, with reference to FIG. 11, the dot pattern buried layer 68 is formed on the surface of the sidewall insulating layer 67a. Then, silicon nitride (SiN) is deposited to embed the buried layer 68, thus forming the sidewall insulating layer 67. The memory layer 60 shown in FIG. 9 is thus formed.

Third Embodiment

Figure 12:
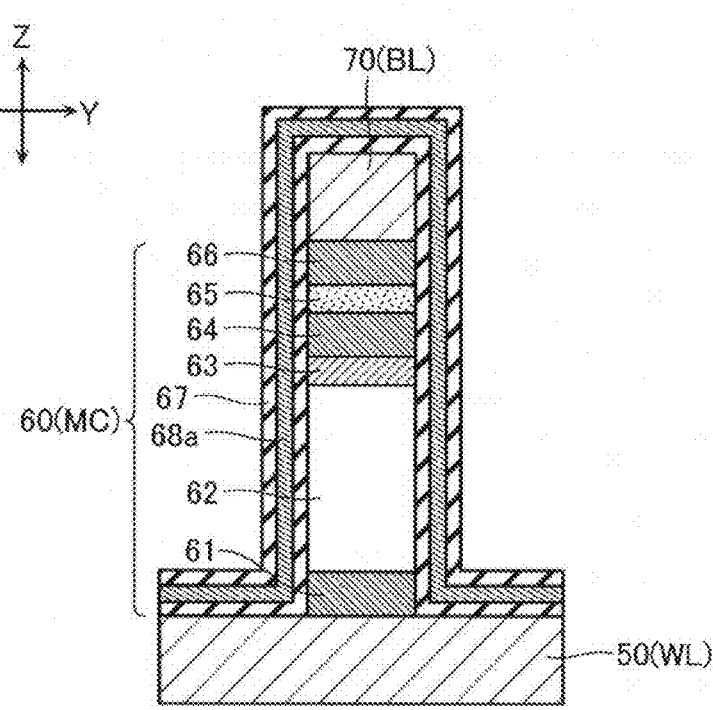
FIG. 12 is a cross-sectional view of a memory layer 60 according to a third embodiment.

Referring now to FIG. 12, a semiconductor memory device according to a third embodiment will be described. With reference to FIG. 12, the third embodiment is different from the second embodiment only in terms of the buried layer 68a. Note that other configurations in the third embodiment are similar to those in the second embodiment and thus their description is omitted here.

With reference to FIG. 12, in the third embodiment, the buried layer 68a is formed, as in the second embodiment, near the center in the thickness direction of the sidewall insulating layer 67. Meanwhile, the buried layer 68a is continuously and linearly formed, unlike in the second embodiment, to cover the electrode layer 61, the diode layer 62, the silicide layer 63, the electrode layer 64, the variable resistance layer 65, and the electrode layer 66. Even in such a configuration, the third embodiment may exert an advantage similar to that in the first embodiment. Note that the manufacturing process in the third embodiment is similar to the manufacturing process in the second embodiment.

Fourth Embodiment

Figure 13:
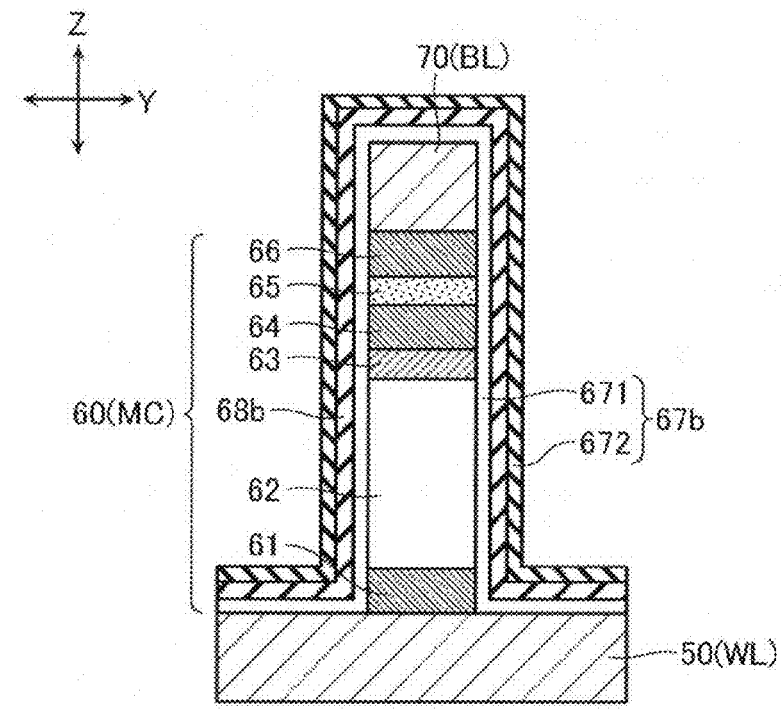
FIG. 13 is a cross-sectional view of a memory layer 60 according to a fourth embodiment.

Referring now to FIG. 13, a semiconductor memory device according to a fourth embodiment will be described. With reference to FIG. 13, the fourth embodiment replaces the sidewall insulating layer 67 in the first embodiment with a sidewall layer 67b. Note that other configurations in the fourth embodiment are similar to those in the first embodiment and thus their description is omitted here.

With reference to FIG. 13, in the fourth embodiment, the sidewall layer 67b include a sidewall semiconductor layer 671 and a sidewall insulating layer 672. The sidewall semiconductor layer 671 is in contact with side surfaces of the electrode layer 61, the diode layer 62, the silicide layer 63, the electrode layer 64, the variable resistance layer 65, and the electrode layer 66. The sidewall semiconductor layer 671 is made of silicon (Si). The sidewall insulating layer 672 is provided on a side surface of the sidewall semiconductor layer 671 via a buried layer 68b. The sidewall insulating layer 672 is made of silicon nitride (SiN). Note that the sidewall insulating layer 672 is formed to perform the WVG (Water Vapor Generation) process.

The buried layer 68b is embedded by the sidewall semiconductor layer 671 and the sidewall insulating layer 672. The buried layer 68b is continuously and linearly formed to cover the sidewall semiconductor layer 671. The buried layer 68b is made of silicon dioxide ($SiO_2$). Note that the buried layer 68b may be formed by oxidizing the sidewall semiconductor layer 671 of silicon.

Even in the above configuration, the fourth embodiment may exert an advantage similar to that in the first embodiment. Further, the sidewall insulating layer 672 (silicon nitride) is not directly in contact with a side surface of the diode layer 62, and is provided on a side surface of the diode layer 62 via the buried layer 68b and the sidewall semiconductor layer 671. This may limit the state generation by the diode layer 62 (silicon) and the sidewall insulating layer 672 (silicon nitride), thereby limiting the reverse current. Further, because of the sidewall semiconductor layer 671 (silicon) between the buried layer 68b (silicon dioxide) and the diode layer 62, the buried layer 68b may behave like silicon dioxide ($SiO_2$) having more silicon (Si), thus limiting charge generation.

Fifth Embodiment

Figure 14:
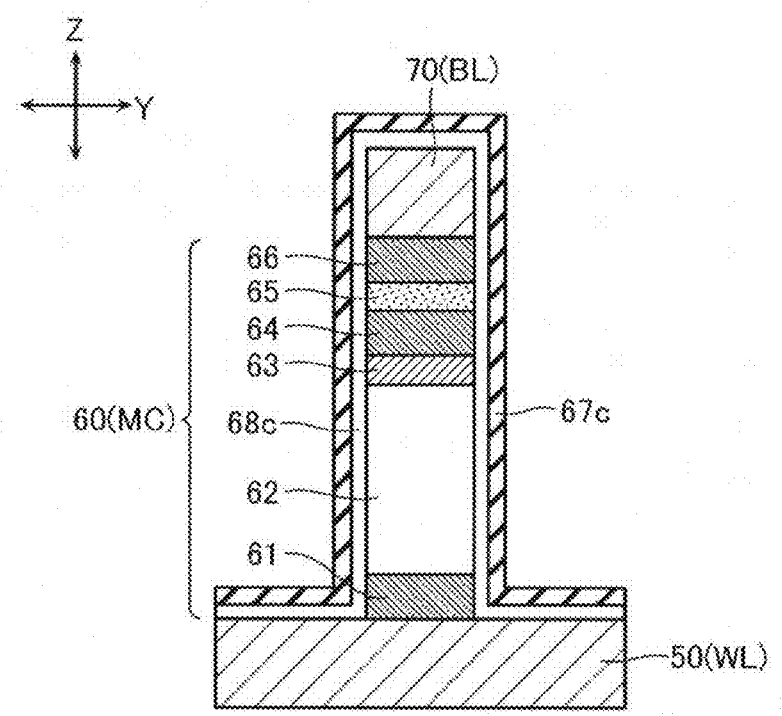
FIG. 14 is a cross-sectional view of a memory layer 60 according to a fifth embodiment.

Referring to FIG. 14, a semiconductor memory device according to a fifth embodiment will be described. With reference to FIG. 14, the fifth embodiment includes a buried layer 68c and a sidewall insulating layer 67c different from those in the first embodiment. Note that other configurations in the fifth embodiment are similar to those in the first embodiment and thus their description is omitted here.

With reference to FIG. 14, the buried layer 68c is continuously and linearly formed to be in contact with and to cover side surfaces of the electrode layer 61, the diode layer 62, the silicide layer 63, the electrode layer 64, the variable resistance layer 65, and the electrode layer 66. The buried layer 68c is made of silicon (Si).

The sidewall insulating layer 67c is provided, via the buried layer 68c, on side surfaces of the electrode layer 61, the diode layer 62, the silicide layer 63, the electrode layer 64, the variable resistance layer 65, and the electrode layer 66. The sidewall insulating layer 67c is formed to perform a process in an oxidizing atmosphere such as WVG (Water Vapor Generation). The sidewall insulating layer 67c is formed by nitriding the buried layer 68c of silicon. Further, the sidewall insulating layer 67c may be made of fully nitrided silicon nitride.

Even in the above configuration, the fifth embodiment may exert an advantage similar to that in the first embodiment. Further, the sidewall insulating layer 67c (silicon nitride) is not directly in contact with a side surface of the diode layer 62, and is provided on a side surface of the diode layer 62 via the buried layer 68c. This may limit the state generation by the diode layer 62 (silicon) and the sidewall insulating layer 67c (silicon nitride), thereby limiting the reverse current. In contrast, if the buried layer 68c is formed with a smaller film thickness and the buried layer 68c (silicon) is nitrided to the vicinity of the side surface of the diode layer 62, thereby forming the sidewall insulating layer 67c, or the buried layer 68c is excessively nitrided to the diode layer 62, the reverse current is increased due to charge.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the above embodiments, the variable resistive element VR changes its resistance by the following (1) to (6) transitions, phase changes, and phase transitions.

(1) a metal-semiconductor transition, a metal-insulator transition, a metal-metal transition, an insulator-insulator transition, an insulator-semiconductor transition, an insulator-metal transition, a semiconductor-semiconductor transition, a semiconductor-metal transition, and a semiconductor-insulator transition.

(2) a phase change in the quantum state (such as a metal-superconductor transition).

(3) a paramagnetic-ferromagnetic transition, an antiferromagnetic-ferromagnetic transition, a ferromagnetic-ferromagnetic transition, a ferrimagnetic-ferromagnetic transition, and a transition comprising a combination thereof.

(4) a dielectric-ferroelectric transition, a dielectric-pyroelectric transition, a dielectric-piezoelectric transition, a ferroelectric-ferroelectric transition, an antiferroelectric-ferroelectric transition, and a transition comprising a combination thereof.

(5) a transition comprising a combination of the above (1) to (4) transitions.

(6) a transition from metal, insulator, semiconductor, ferroelectric, dielectric, pyroelectric, piezoelectric, ferromagnetic, ferrimagnetic, helimagnetic, paramagnetic, or antiferromagnetic to ferroelectric-ferromagnetic, and vice versa.

The variable resistance layer 64 may also be made of any of first to third oxides and oxynitride described below.

A first oxide includes $SiO_2$, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO, and a combination thereof.

A second oxide is "$AB_2O_4$." Note that A and B are the same or different elements and each of A and B includes Mg, Al, Sc, Ti, V, Cr, Mn, Fe, Co, Ni, Cu, Zn, Ga, Ge, and a combination thereof. For example, the second oxide is $Fe_3O_4$, $FeAl_2O_4$, $Mn_{1+x}Al_{2-x}O_{4+y}$, $Co_{1+x}Al_{2-x}O_{4+y}$, $MnO_x$, or the like.

A third oxide is "$A_BO_3.$" Note that A and B are the same or different elements and each of A and B includes Mg, Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, Sn, and a combination thereof. The third oxide is, for example, $LaAlO_3$, $SrHfO_3$, $SrZrO_3$, $SrTiO_3$, or the like.

The oxynitride is SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, or AlSiON. The oxynitride is also the above first to third oxides whose oxygen elements are partially substituted by a nitrogen element.

Although, in the above embodiments, the buried layers 68, 68a, and 68b are each formed as one layer, the buried layers 68, 68a, and 68b may be formed in a plurality.

What is claimed is:

1. A semiconductor memory device comprising:
   a semiconductor layer functioning as a rectifying device;
   a variable resistance layer provided above or below the semiconductor layer, and reversibly changing its resistance;
   a sidewall layer contacting the sidewall layer, and
   being made of material different from that of the sidewall layer, wherein the buried layer is formed in a plurality in a dot pattern.

2. The semiconductor memory device according to claim 1, wherein
   the buried layer is made of material having a charge generation property.

3. The semiconductor memory device according to claim 1, further comprising:
   a first wiring extending in a first direction; and
   a second wiring extending in a second direction, wherein the semiconductor layer and the variable resistance layer are provided in a region in which the first wiring and the second wiring are crossing, the region being between the first wiring and the second wiring.

4. The semiconductor memory device according to claim 1, wherein
   the buried layer contacts a sidewall of the semiconductor layer.

5. The semiconductor memory device according to claim 1, wherein
   the buried layer is formed in a center in a thickness direction of the sidewall layer.

6. The semiconductor memory device according to claim 1, further comprising:
   a first electrode layer contacting a lower surface of the semiconductor layer;
   a silicide layer contacting an upper surface of the semiconductor layer;
   a second electrode layer contacting a lower surface of the variable resistance layer; and
   a third electrode layer contacting an upper surface of the variable resistance layer.

7. The semiconductor memory device according to claim 1, further comprising:
   a first wiring extending in a first direction; and a second wiring extending in a second direction, where
the semiconductor layer and the variable resistance layer are provided in a region in which the first wiring and the second wiring are crossing, the region being between the first wiring and the second wiring,
the buried layer is formed in a plurality in a dot pattern, and is made of material having a charge generation property.

8. The semiconductor memory device according to claim 1, wherein
the buried layer is made of contamination in the sidewall layer.

9. A semiconductor memory device comprising:
a semiconductor layer functioning as a rectifying device;
a variable resistance layer provided above or below the semiconductor layer, and reversibly changing its resistance;
a buried layer contacting a sidewall of the semiconductor layer wherein the buried layer is formed in a plurality in a dot pattern and
a sidewall layer provided on a sidewall of the semiconductor layer via the buried layer, and being made of material different from that of the buried layer.

10. The semiconductor memory device according to claim 9, wherein
the buried layer is made of silicon, and
the sidewall layer is made of silicon nitride.

11. The semiconductor memory device according to claim 9, wherein
the buried layer is made of silicon, and
the sidewall layer is made of silicon oxide.

12. The semiconductor memory device according to claim 9, wherein
the buried layer is made of silicon, and
the sidewall layer is made of fully nitrided silicon nitride.

13. The semiconductor memory device according to claim 9, wherein
the buried layer is made of material having a charge generation property.

14. A semiconductor memory device comprising:
a semiconductor layer functioning as a rectifying device;
a sidewall layer contacting a sidewall of the semiconductor layer;
a buried layer embedded in the sidewall layer, and being made of material different from that of the sidewall layer,
the buried layer being formed in a plurality in a dot pattern.

15. The semiconductor memory device according to claim 14, wherein
the buried layer is made of material having a charge generation property.

* * * * *